United States Patent [19]
Wollesen

[11] Patent Number: 6,150,693
[45] Date of Patent: Nov. 21, 2000

[54] SHORT CHANNEL NON-SELF ALIGNED VMOS FIELD EFFECT TRANSISTOR

[75] Inventor: Donald L. Wollesen, Saratoga, Calif.

[73] Assignee: Advanced Micro Devices, Sunnyvale, Calif.

[21] Appl. No.: 09/076,469

[22] Filed: May 12, 1998

Related U.S. Application Data

[63] Continuation of application No. 08/714,318, Sep. 18, 1996, abandoned.

[51] Int. Cl.[7] ............................ H01L 29/76; H01L 29/94; H01L 31/062
[52] U.S. Cl. ........................ 257/330; 257/329; 257/333; 257/334; 438/271; 438/282; 438/283
[58] Field of Search ..................... 257/330, 329, 257/333, 334; 438/271, 282, 283

[56] References Cited

U.S. PATENT DOCUMENTS

| | | |
|---|---|---|
| 4,003,126 | 1/1977 | Holmes et al. . |
| 4,065,783 | 12/1977 | Ouyang . |
| 4,102,714 | 7/1978 | DeBar et al. . |
| 4,116,720 | 9/1978 | Vinson . |
| 4,131,907 | 12/1978 | Ouyang . |
| 4,272,302 | 6/1981 | Jhabvala ..................... 148/1.5 |
| 4,316,203 | 2/1982 | Tohgei ........................ 357/23 |
| 4,502,208 | 3/1985 | McPherson . |
| 4,567,641 | 2/1986 | Baliga et al. . |
| 4,682,405 | 7/1987 | Blanchard et al. . |
| 4,784,973 | 11/1988 | Stevens et al. . |
| 5,451,805 | 9/1995 | Yang . |
| 5,466,616 | 11/1995 | Yang . |
| 5,474,943 | 12/1995 | Hshieh et al. . |
| 5,502,322 | 3/1996 | Jung et al. . |
| 5,508,547 | 4/1996 | Yang . |
| 5,543,337 | 8/1996 | Yeh et al. . |

FOREIGN PATENT DOCUMENTS

| | | |
|---|---|---|
| 53151632 | 7/1978 | European Pat. Off. . |
| 55173539 | 9/1980 | European Pat. Off. . |
| 27 24 165 | 5/1977 | Germany . |
| 52-15274 | 2/1977 | Japan . |
| 52-63074 | 5/1977 | Japan . |
| 54-133078 | 10/1979 | Japan . |
| 55-11302 | 1/1980 | Japan . |
| 55-91874 | 7/1980 | Japan . |
| 56-62365 | 5/1981 | Japan . |
| 58-145156 | 8/1983 | Japan . |
| 2-110973 | 4/1990 | Japan . |
| 2-153572 | 6/1990 | Japan . |

OTHER PUBLICATIONS

Sun, et al "Electron Mobility in Inversion and Accumulation Layers on Thermally Oxidized Silicon Surfaces", IEEE, Aug. 1980.

Ou–Yang, "Double Ion Implanted V–MOS Technology", IEEE Journal of Solid State Circuits, vol. SC–12, No. 1, pp. .3–10, Feb. 1977.

Hsu, et al. "Multiple V–Grove Fet", IBM Technical Disclosure Bulletin, vol. 19, No. 6, pp. 2135–2136, Nov. 1976.

Jhabvala, et al. "A Combined DMOS–VMOS Complementary IC Structure", Electrochemical Society Spring Meeting, Philadelphia, PA, May 8–13, 1977, Electrochem. Soc. USA pp. 226–228.

Primary Examiner—Donald L. Monin, Jr.
Assistant Examiner—S. H. Rao
Attorney, Agent, or Firm—Foley & Lardner

[57] ABSTRACT

A field effect transistor (FET) with a V-shaped trench gate in a semiconductor substrate having gate oxide on the walls of the trench and a gate electrode material within the trench walls, and source/drain impurities in the semiconductor substrate and abutting the gate oxide. The resultant FET structure comprises a non-self align V-shaped gate with an effective channel length ($L_{eff}$) of less than about one-half of the surface width of the gate. Because of the V-shaped structure of the gate, the effective length of the channel only extends from the edge of the source to the tip of the V-shaped gate. Due to this characteristic, the width of the gate at the surface of the semiconductor substrate can be two or more time the distance of the desired channel length thereby permitting conventional lithography to be used to fabricate gate lengths much shorter than the lithography limit. Preferably, the bottom or tip of the V shaped gate is rounded and concave.

7 Claims, 5 Drawing Sheets

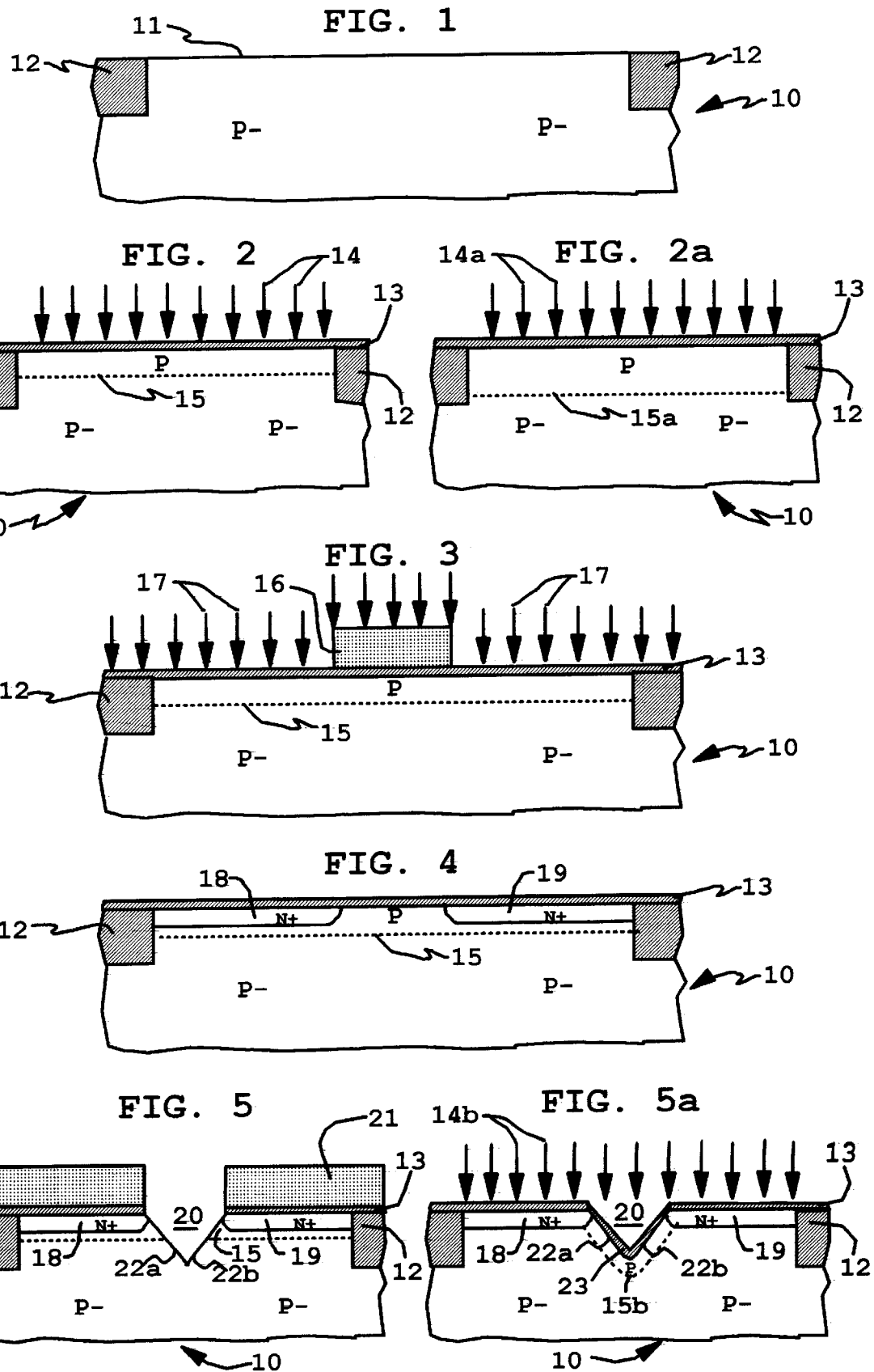

is deposited in and fills the remaining portion of the trench. (Although V-shaped will be described and shown in the drawings, a U-shaped gate also is contemplated by this invention.) If desired, a silicide may be formed on both source/drain regions and the polysilicon to lower the resistivity of these areas. Contacts are made to the source, drain, and gate to complete the FET structure. Preferably, a barrier metal may be used to line the contacts and isolate the contacts from insulating material.

SHORT CHANNEL NON-SELF ALIGNED VMOS FIELD EFFECT TRANSISTOR

CROSS REFERENCES TO RELATED APPLICATIONS

This is a continuation of Ser. No. 08/714,318, filed Sep. 18, 1996, now abandoned.

This application is related to U.S. patent application Ser. No. 08/714,317, now U.S. Pat. No. 5,808,340, entitled SHORT CHANNEL SELF ALIGNED VMOS FIELD EFFECT TRANSISTOR, filed on an even date with the parent U.S. patent application Ser. No. 08/714,318. This cross referenced application is incorporated by reference into this application.

FIELD OF THE INVENTION

The present invention relates to a field effect transistor and, more specifically, a field effect transistor with an effective channel length of less than a quarter micron and a method of fabricating such field effect transistor.

BACKGROUND OF THE INVENTION

With higher levels of integrated circuits on semiconductor chips and the need for faster transistors in these circuits, the FET transistor in production today, such as a MOSFET, is fabricated with an effective channel length of about $0.5\mu$. To increase the speed of the transistor even faster, the channel length of the FET must be reduced below $0.25\mu$. This dimension approaches the limits of optical lithography and semiconductor manufactures are resorting to techniques like phase shift lithography, which require expensive masks but permit optical lithography to achieve these small line widths. Semiconductor manufacturers also are resorting to X-ray lithography which is extremely costly from an exposure equipment and mask making standpoint. Although electron beam is another alternative, its throughput is extremely slow when it is used in a direct write mode.

SUMMARY OF THE INVENTION

Accordingly, it is an object of the present invention to provide a method manufacturing an integrated circuit with FET transistors with extremely short channel lengths which permits the use of conventional optical lithography.

A further object of the present invention to design the width of a gate electrode of a FET of a dimension to permit conventional optical lithography but with a structure such that it has an effective channel length of less than one-half of the gate width.

Another object of the present invention design is a FET structure with an extremely short channel which does not require lightly doped drains or other double doping to create the source and drain.

In accordance with the present invention, source/drain impurities either are diffused or implanted into the areas of the substrate on opposite sides of a mask in the position of a subsequent gate, preferably, prior to the formation of the source and drain, a double diffused channel or DMOS structure is formed by a shallow implant of an opposite impurity type. A trench or groove having converging walls is formed in a semiconductor substrate at the position-of the now removed mask and a gate oxide is grown on the walls to the surface of substrate. Preferably, the bottom of the walls are rounded and the inside angle of the converging walls at the bottom of the trench is in the range of about 66° to about 123°. A gate material, such as polysilicon or metal, Because of the V-shaped structure of the gate, the effective saturated length of the channel with drain voltage applied only extends from the edge of the source to just prior to the tip of the V-shaped structure in the interior of the semiconductor substrate. The drain side of the V-shaped structure becomes a depletion region due to the applied drain voltage. Due to this characteristic of such a structure, the surface width of the gate can be, for example, two or more times the distance of the desired channel length thereby permitting conventional lithography to be used to define the gate lengths much shorter than the lithographic limit.

In accordance with another aspect of the present invention, the resultant FET structure comprises a non-self aligned gate with converging walls and having conventional source and drains surrounded by field isolation, but with an effective channel length ($L_{eff}$) of less than about one-half of the surface width of the gate, the surface portion of which extends onto the field isolation. Preferably, the bottom of the gate is rounded and the inside angle of the converging walls at the bottom of the trench are in the range of about 66° to about 123°.

BRIEF DESCRIPTION OF THE DRAWINGS

The foregoing and other objects, aspects and advantages will be better understood from the following detailed description of preferred embodiments of the invention with reference in the drawings, in which:

FIG. 1 is a cross-sectional view of a semiconductor substrate doped with an impurity and having recessed field oxidation for transistor isolation.

FIG. 2 is a cross-sectional view of the doped substrate with a screen oxide layer and being shallow ion implanted for transistor threshold control or adjusting $V_T$.

FIG. 2a is a cross-sectional view of the doped substrate with a screen oxide layer and being conventionally ion implanted for transistor threshold control or adjusting $V_T$.

FIG. 3 is a cross-sectional view of the doped semiconductor substrate showing a resist mask on the screen oxide defining source and drains regions and the implanting of the source and drain.

FIG. 4 is a cross-sectional view of the doped semiconductor substrate after annealing and showing the source and drain profiles.

FIG. 5 is a cross-sectional view of the doped semiconductor substrate with a patterned resist to define the gate region and an etched V-shaped trench.

FIG. 5a is a cross-sectional view of the doped semiconductor substrate having a protective oxide layer over the source and drain regions and a conventional ion implantation in the gate region for transistor threshold control or adjusting $V_T$.

DETAILED DESCRIPTION OF THE PREFERRED EMBODIMENTS OF THE INVENTION

Figure 6:
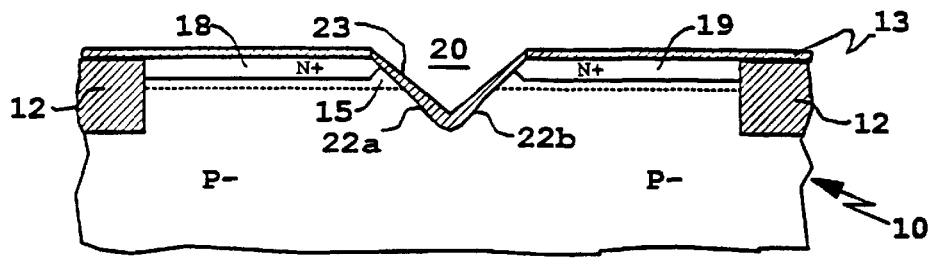
FIG. 6 is a cross-sectional view of the doped semiconductor substrate having a sacrificial oxide formed on the V-shaped trench walls.

Referring now to the drawings and, more particularly to FIG. 1, a portion of a semiconductor body, herein a silicon crystalline body 10 doped with a P– impurity of boron is shown. The crystalline silicon body 10 consists of crystallographic planes including a (100) plane, a (110) plane and a (111) plane. The upper or top surface 11 of the silicon crystalline body 10 is in the (100) plane and recessed field isolation oxide (FOX) regions 12 have been formed to isolate this transistor from other devices in an integrated circuit. An insulating layer, herein silicon oxide 13 with a thickness in the range of 500 Å to 1000 Å, is grown on the upper surface 11 of the semiconductor body, as shown in FIG. 2, by exposing it to oxygen ($O_2$) at a temperature in the range of 800° C. to 900° C. for about 50 minutes. For threshold control of a N-type field effect transistor (FET), a $V_T$ adjust impurity, herein a P impurity of boron, is shallow implanted, as illustrated by the arrows 14, at a dosage of $10^{18}$ at an energy of 20–30 keV into the upper surface of the silicon body 10, as shown in FIG. 2. Alternatively, a N impurity of, for example, phosphorus, would be used for a P-type FET. After annealing, preferably by a rapid thermal anneal of 950° C. for 35 minutes, a P impurity region is formed, as illustrated by the dashed line 15 in FIG. 2. A double diffused channel or DMOS channel is preferred so that only shallow diffusion of the P impurity results from the annealing which gives a graded doping away from the source to be formed and which provides a shorter electrical channel length than the physical channel length. This is because the channel length is determined by lateral diffusion of two complementary diffusions. In addition, the P doping in the channel region is higher than in the drift region which will reduce the channel length modulation and the probability of punch through. If a conventional channel is desired, the impurity must be diffused deeper during annealing as shown by dashed line 15a in FIG. 2a.

To create the source and drain which, for purposes of this description, N+ impurities, herein arsenic (As) (or alternatively, P+ impurities, herein boron), will be used for fabricating an N-type (or P-type) FET transistor. A resist material 16, herein a commercially available optical photoresist and preferably one which is sensitive to deep ultra violet (UV) light, is coated on the oxide layer 13 and exposed and developed to form the pattern shown in FIG. 3. With the layer 13 serving as a screen and the patterned photoresist 16 serving as a mask, the ions are implanted, as illustrated by the arrows 17, in the semiconductor body 10. The implantation for herein an N-type transistor is carried out at an energy of 50 keV and with a dosage of $2 \times 10^{15}$ for arsenic or, alternatively, at 25 keV with a dosage of $1 \times 10^{15}$ for boron and a P-type transistor. To repair any implant damage, activate the ions and vertically and laterally diffuse the ions, the semiconductor body 10 is annealed at a temperature of 900° C. for 10 minutes to yield metallurgical junctions or diffusion profiles of the source 18 and drain 19 as shown in FIG. 4 with the photoresist removed.

To form a trench or groove 20 with converging walls, preferably a V-shaped trench, as shown in FIG. 7 in the semiconductor body 10, the oxide layer 13, after being patterned for the gate region with a conventional optical photoresist 21, is first etched (not shown) to the surface 11 of the silicon body 10 using anisotropic etching to form an opening between the source 18 and drain 19 regions. Herein, a parallel plate reactive ion etcher, or any other known ion etching apparatus that etch anisotropically and a gas or gases containing fluorine (F–) ions whose formulation is more selective for silicon oxide than silicon, is used to form the opening. The unetched layer 13 over the source 18 and drain 19 regions serves as an etch stop for etching the V-shaped trench or, alternatively, the photoresist can be left on during the etching of the V-shaped trench or groove 20 and the resist will also serve as an etch stop. The silicon body 10 now is exposed in the opening to an anisotropic etchant, anisotropic in that it etches the (100) plane in preference to the (111) plane of the silicon body 10. Herein, solutions of either hydrazine and water, ethylene-diamine, potassium hydroxide or preferably pyrocatechol is used to preferentially etch the (100) plane and not the (111) plane. The etching stops when all of the (100) plane is consumed and a V-shaped trench or groove 20 with walls 22a and 22b being formed, as shown in FIG. 5. The angle of the V-shaped trench 15 is about 57° relative to the surface of the silicon body 10. With the depth being measured down either angled side, $D_s$, of the trench for a given opening width, W, $D_s$ then =0.92W. If the desired gate width is 0.18 μm, the depth of the trench should be about 0.165 μm. If it is desired to form a U-shaped trench or groove, one method is to stop the etching before consumption of the (100) plane so that the bottom of the trench or groove will be flat intercepting the walls 16 at an angle of 123° relative to the surface of the silicon body 10.

Alternatively, the conventional channel implant described relative to FIG. 2a can be performed after the formation of the V-shaped trench, as shown by the arrows 14b and illustrated by the dashed line 15b of FIG. 5a. The conditions for such an implant will be with a dosage of $10^{18}$ at an energy of 20–30 keV and with a screen or sacrificial thermal oxide 23 grown on the walls 22a and 22b with the shallow P implant.

With the trench or groove 20 formed, preferably in a V-shape, a sacrificial oxide 23 is grown on the walls 22a and 22b as shown in FIG. 6, using oxidation conditions as described above but with a shorter time to grow a thinner oxide layer; for example, $SiO_2$ at around 950° C. for about 20 minutes so as to grow an oxide thickness of about 60 Å to 80 Å for a desired effective channel length of 0.1 μm. Gate oxides either thinner or thicker than described in this embodiment may be used. The oxide layer 13 over the source 18 and drain 19 regions becomes thicker during the growing of the gate oxide 23.

Figure 7A:
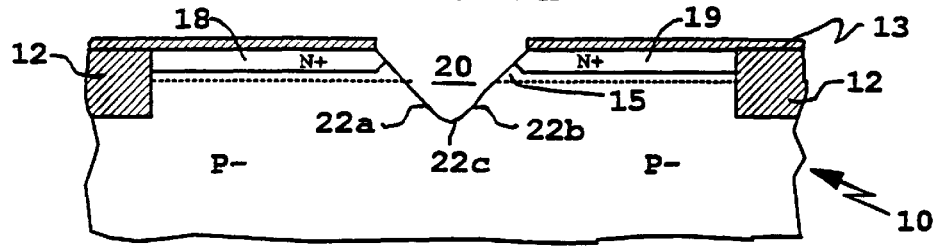
FIG. 7a is a cross-sectional view of the doped semiconductor substrate with the preferred method of removing the sacrificial oxide from the V-shaped trench walls.
Figure 7B:
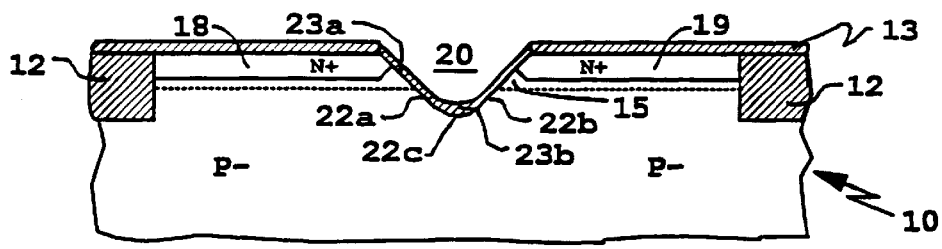
FIG. 7b is a cross-sectional view of the doped semiconductor substrate with the gate oxide regrown on the V-shaped trench walls.

Preferably, the sacrificial oxide 23 may be thicker than 80 Å since it is removed after being grown as shown in FIG. 7a. The sacrificial oxide 23 is removed by wet and preferably dry etching using the reactive ion etcher and etchants described for making the opening in the surface oxide 13. This sacrificial oxidation serves to round the bottom angle 22c of the V-shaped trench 20 more than a single gate oxidation and, hence, the bottom angle is increased in the device channel region, which reduces peak electric field strength. Such a reduction in peak electric field strength will serve to improve the breakdown of the gate oxide, which is regrown as layer 23a, as shown in FIG. 7b, using the similar conditions as described above for the growth of a 60 Å to a 80 Å thickness. Due to the sacrificial oxidation step, the oxide layer 23a is formed with a rounded bottom 23b as shown in FIG. 7b.

Figure 8:
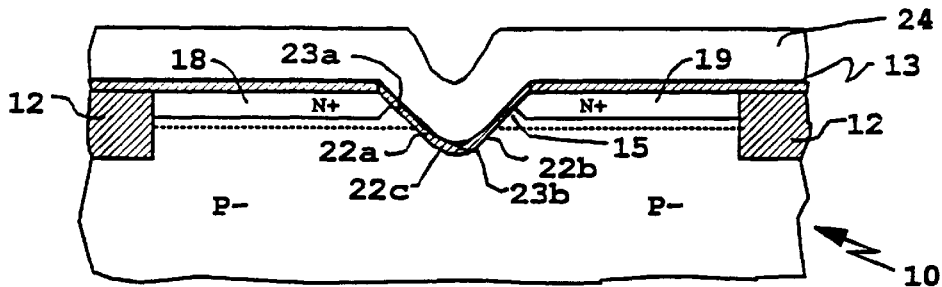
FIG. 8 is a cross-sectional view of the doped semiconductor substrate having a gate material deposited on the oxide surface of the semiconductor substrate and in the V-shaped trench.

Doped polysilicon is the preferred gate electrode and it can be deposited from a silicon precursor, such as silane ($SiH_4$), by being doped at the time of deposition by incorporating an impurity precursor, such as diborane for boron (B) for a P-type transistor and herein phosphine for phosphorus (P) for the N-type transistor, in with the silane gas. Preferably, the doped polysilicon 24 is chemically vapor deposited (CVD) on the gate oxide layer 23 in an amount to more than fill the V-shaped trench as shown in FIG. 8.

Figure 9:
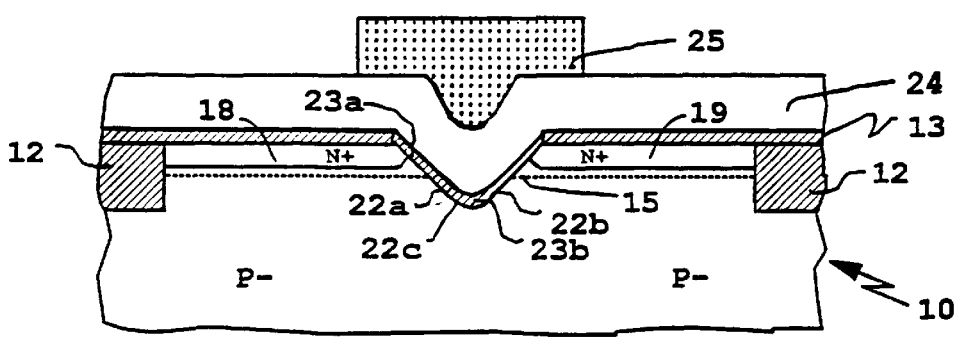
FIG. 9 is a cross-section view of the doped semiconductor substrate having a resist pattern on the gate material and over the gate region.
Figure 10:
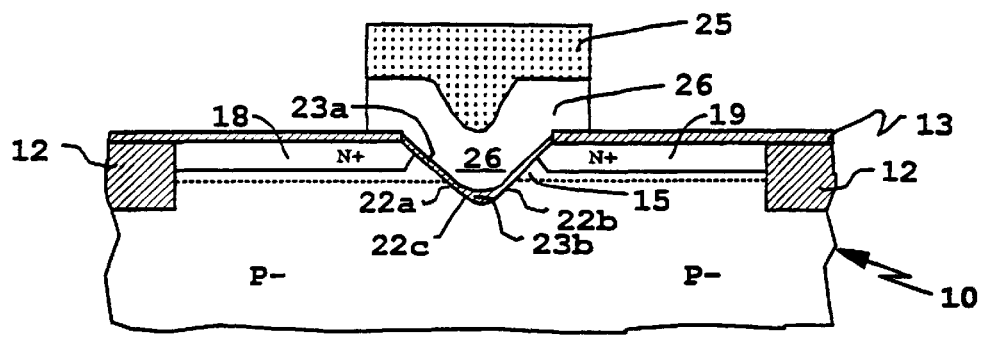
FIG. 10 is a cross-sectional view of the doped semiconductor substrate having the gate material etched in the pattern of the resist to form the gate electrode with a source and drain formed in the substrate and on opposite sides of the trench gate.

Next, a conventional photoresist 25 is patterned over the V-shaped trench 20 filled with polysilicon 24 of a size-to be wider than the gate width, as shown in FIG. 9, for subsequently removing the polysilicon 24 not covered with the photoresist. With photoresist 25 serving a mask, the polysilicon 24 is anisotropically etched using a known etchant which is more selective for polysilicon than it is for silicon oxide layer 13 and FOX 12 which underlie the polysilicon and will act as etch stops. A parallel plate reactive ion etcher or any other known anisotropic etcher may be used. The V-shaped gate 26 of herein polysilicon, but alternatively could be polycide or metal, is thus formed, as shown in FIG. 10 before the photoresist 25 is removed. When a polysilicon or polycide gate is used, the gate material may be doped heavily (e.g. with phosphorous for a N-type transistor) prior to opposite dopant type implant so that the opposite dopant implant will not cause a conversion. Although this description is specific to N-type transistor, the present invention contemplates P-type and complementary FETs and other types of FETS.

Figure 11:
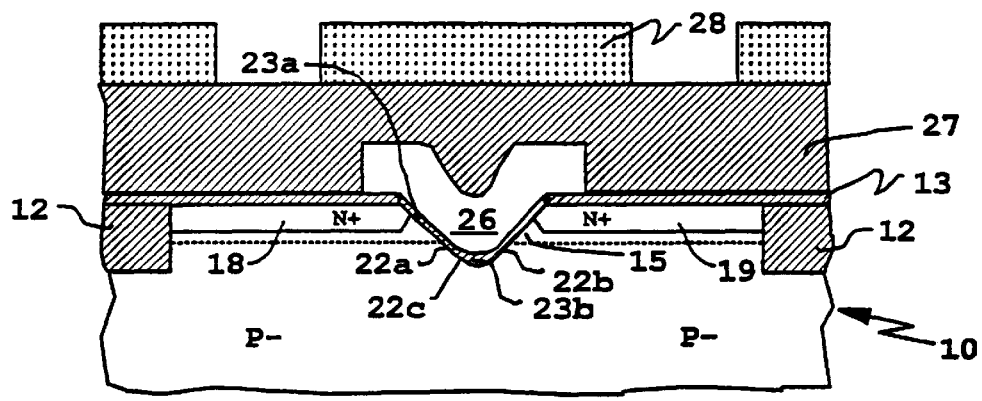
FIG. 11 is a cross-sectional view of the doped semiconductor substrate having a thick insulating layer formed on the oxide layer and the gate electrode and a photoresist pattern formed to define the source, drain and gate contact vias.

With the source 18, drain 19 and gate 26 now fabricated, the remaining steps are dedicated to forming the contacts to the source, drain and gate separated by insulation as will be described in conjunction with FIGS. 11 through 15. In FIG. 11, an insulating layer 27 is deposited on the oxide layer 13, the gate electrode 26, and FOX 12, preferably by chemical vapor deposition (CVD) of a conformal silicon oxide precursor, such as herein tetraethylorthosilicate (TEOS) or tetramethylcyclotetrasilane to form silicon oxide as layer 27. A resist layer 28, again a commercially available photoresist, is formed on the oxide layer 27 by spin coating, followed by exposure and development to create the pattern shown in FIG. 11.

Figure 12:
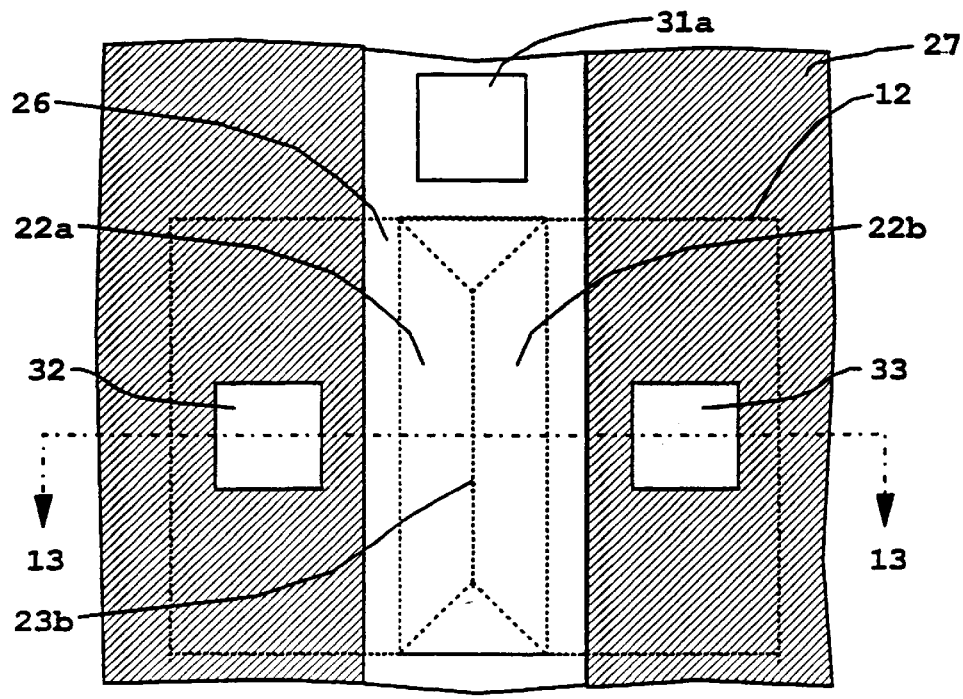
FIG. 12 is a plan view of FIG. 11 and illustrates the position of the contact vias of the source, drain and gate regions.

To further illustrate the positions of the contacts to be formed, FIG. 12 is a plan view showing the extension of the polysilicon gate 26 so that contact is made away from the source and drain regions. The outer area in dashed lines shown in FIG. 12 is the field oxide isolation region or FOX 12 of the source region 18, drain region 19 and the gate electrode region 26. The V-shaped trench 22a, 22b and 23c of the gate electrode 26 is shown in dashed lines between the source and drain and the gate electrode 26 extends over the FOX region 12 to permit the contact to be made. Contact openings 32, 33 and 31a are shown in FIG. 12 for connecting to the source 18, drain 19 and gate 26 respectively.

Figure 13:
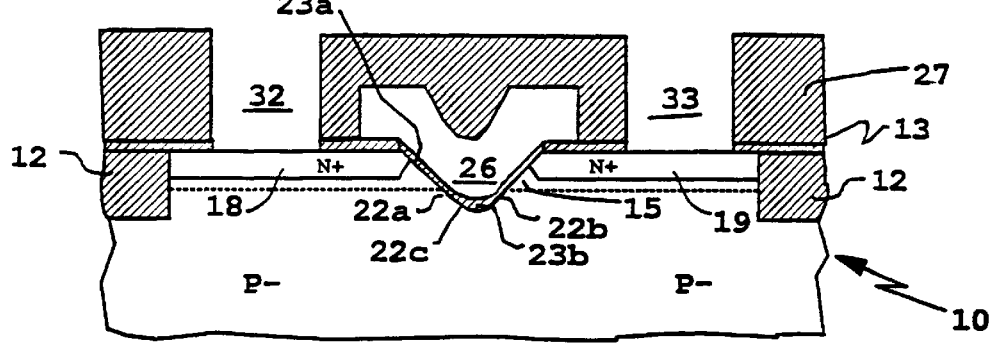
FIG. 13 is a cross-sectional view of the doped semiconductor substrate taken along line 13—13 of FIG. 12 with the oxide and insulating layers above the source, drain and gate regions removed to form contact via openings.
Figure 14:
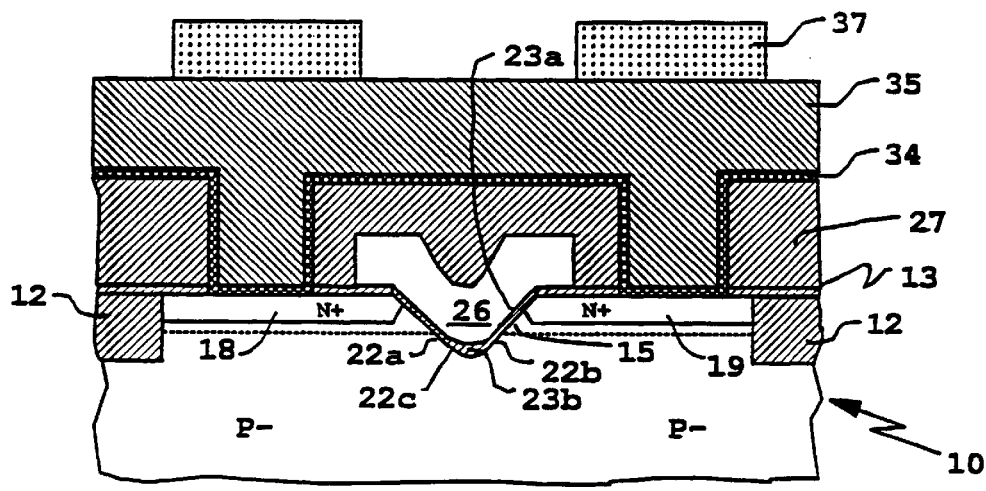
FIG. 14 is a cross-sectional view of the doped semiconductor substrate with a barrier material and a conductor material on the insulating layer and in the contact via openings, and a resist pattern to define the areas of the conductive material to be removed to form conductive lines for connecting source, drain and gate regions in an integrated circuit.
Figure 15:
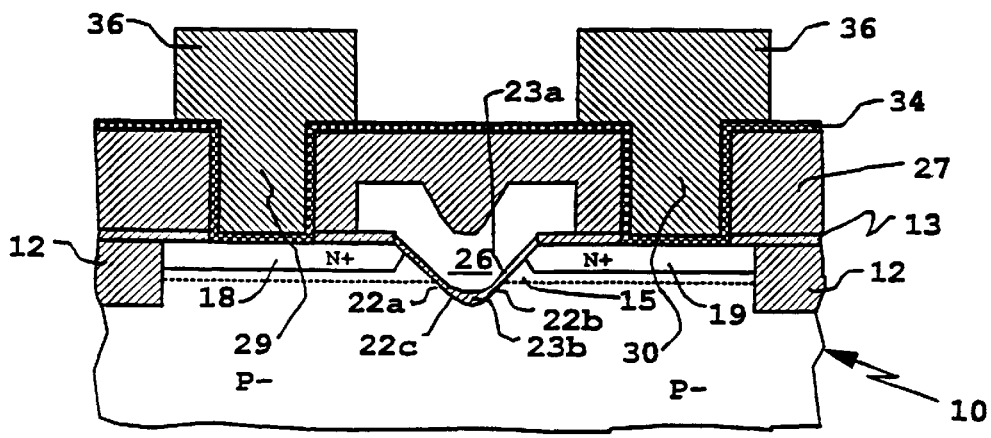
FIG. 15 is a cross-sectional view of the doped semiconductor substrate with the conductive material and resist removed to complete the FET.

As shown in FIG. 13, contact opening 32 for the source contact 29 and contact opening 33 for drain contact 30 are made in the insulating layer 27 using the photoresist pattern 28 and a contact opening (not shown) for gate contact 31 by etching the oxide layer 28 using anisotropic etching as previously described for etching the oxide layer 12. The etchant gas or gases have a higher selectivity for oxide over silicon so that the silicon body 10 serves as an etch stop at the surface 11 of the silicon body. Next, a barrier metal 34, herein TiON or alternatively $TiN_2$, is deposited the walls of contact openings 32 and 33 and the gate contact opening (not shown) and on the source 18 and drain 19, respectively, and on the polysilicon gate electrode 26 (not shown) followed by a deposition of a conductive material 35 of preferably copper doped aluminum, or alternatively tungsten, on the barrier metal 34 as shown in FIG. 15. Both the barrier metal and the conductive material 32 can be deposited by either sputtering or by CVD. To complete the contacts 29, 30 and 31 for the source 18, drain 19 and gate 26, respectively, and to form conductive lines 36 (FIG. 15) for connecting to other devices in the integrated circuit, a patterned photoresist 37 provides a mask for etching the barrier metal 34 and conductive material 35 with herein a parallel plate reactive ion etcher with an etchant, such as $CCl_4$ which is more selective for the metals than the silicon oxide insulating layer 28, as shown in FIG. 15 after etching and with the photoresist removed. This completes the basic structure of the N-type FET with a V-shaped gate.

Figure 16:
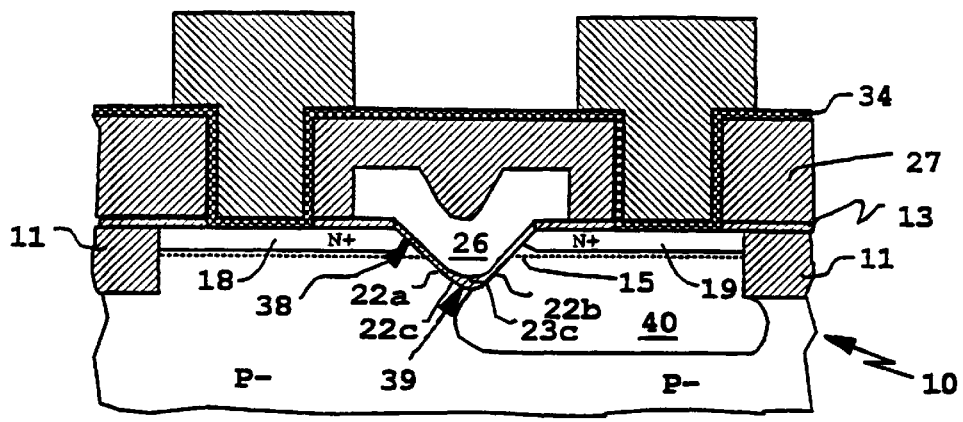
FIG. 16 is an enlarged cross-sectional view of the completed FET with the shallow implantation of FIG. 2 and with the effective channel length and depletion region depicted during operation.
Figure 16A:
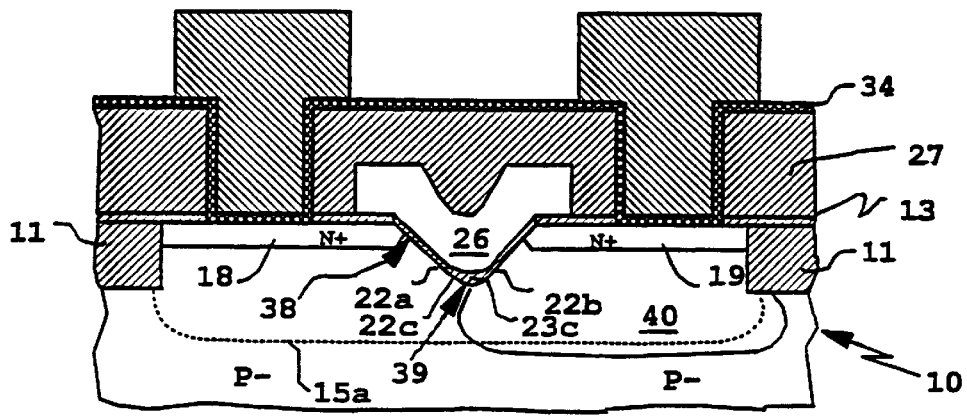
FIG. 16a is an enlarged cross-sectional view of the completed FET with the conventional threshold control implantation of FIG. 2a and with the effective channel length and depletion region depicted during operation.
Figure 16B:
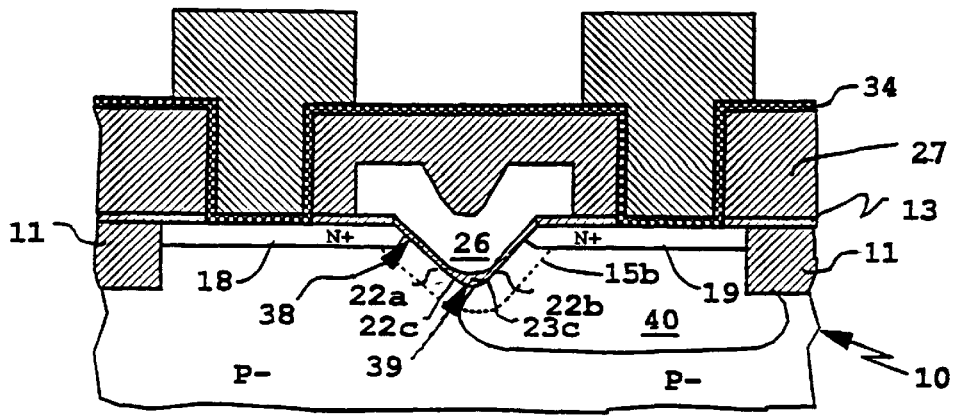
FIG. 16b is an enlarged cross-sectional view of the completed FET with the conventional threshold control implantation of FIG. 5a and with the effective channel length and depletion region depicted during operation.

To more fully understand the present invention, FIG. 16 depicts a DMOS having a shallow and varied VT adjustment 15, shallow in that, after annealing, the diffused implant extends from slightly below the source 18 and drain 19 profile or metallurgical junction and to a point above the tip of the V-shaped gate 26, and varied in that the concentration of the impurity varies or is graded along the channel with the lightest concentration being at its deepest point in the silicon body 10. With a voltage applied to the V-shaped drain electrode, such as 2 volts to the gate 26, and a bias voltage applied to the substrate 10 and because of the V-shape of the gate electrode 26, the effective length of the channel only extends from the edge 38 of the source's metallurgical junction to approximately at the tip 39 of the V-shaped gate electrode 26. On the drain side of V-shaped gate electrode, a large depletion region 40 forms when this device is operating in its saturation region. FIGS. 16a and 16b illustrate two conventional NMOS VFETs with conventional P-type implantation and with uniform channel doping of impurities and with the VT doping of 15a of FIG. 16a extending substantially uniform in concentration between the FOX 12 and in depth below the tip of the V-shaped gate electrode 26, and with the VT doping of 15b of FIG. 16b extending substantially uniform in concentration and surrounding the V-shaped gate and to a depth below the top of the gate. Substantially uniform in both the FIGS. 16a and 16b embodiments mean that the concentration of the impurities along the channel is uniform because the impurities are diffused below the tip of the V-shaped gate 26.

The major advantage that can be taken from this restricted effective channel length ($L_{eff}$) due to the V-shaped gate electrode is that a gate width can be lithographically formed more than two and possibly five times larger than the desired effective channel length ($L_{eff}$) For example, if a channel length ($L_{eff}$) as short as 0.06 μm is desired, with an N+ junction depth of 1,000 Angstroms, only a gate width of 0.18 μm would have to be fabricated, which is within optical lithography limits. Moreover, the present invention is extendable beyond optical lithography and if X-ray lithography were used to fabricate a gate width of 0.09 μm, the effective channel length ($L_{eff}$) with the V-shaped gate electrode of the present invention would be 0.03 μm.

Although this invention has been described relative to specific materials, and apparatuses for depositing and etching doping these materials, it is not limited to the specific materials or apparatuses but only to their specific characteristics. Other materials and apparatus can be substituted for those described herein which will be well understood by those skilled in the microelectronics and semiconductor arts after appreciating the present invention. Further, even though the preferred embodiments have been illustrated as a N-type or N-channel FET, those skilled in the art will recognize that, by reversing all the dopants from N to P and from P to N, P-type or P-Channel FETs or devices can be fabricated and, with additional process steps known in the art, both N-Channel and P-Channel transistors can be fabricated for CMOS and BiFET including BiCMOS applications.

Having thus described the invention, what is claimed is:
1. A field effect transistor (FET) comprising:

a semiconductor substrate having a surface with a (100) plane, said substrate having a trench opening for a gate therein and having a width at the substrate surface and V-shaped angled walls extending from the surface of and converging together in the interior of said substrate, said V-shaped walls at the bottom of the trench curve toward each other to create a round and concave shape only at bottom of the trench;

an insulating layer disposed on the walls of the opening for said gate for insulating the gate from said substrate;

a gate material disposed in said opening on said insulating layer and having a gate width at the substrate surface wider than the width of the trench opening to define a gate region;

source and drain regions disposed in said substrate and on opposite sides of said gate with the edge of each of their metallurgical junctions abutting the underside of the insulating layer on one of said angled walls;

an impurity underlying the channel and being opposite in type to the impurity of the source and drain to create a double diffused (DMOS) FET, said opposite impurity type extending from slightly below the source and drain metallurgical junctions and to a point above the bottom of the gate trench and varying in concentration along the channel with the lightest concentration being at the deepest point of the impurity in the substrate; and conductive contacts electrically connected to each of the source, drain and gate and each contact being insulated from the other, whereby, when a voltage is applied to said drain contact, a depletion region forms from the bottom of the trench and extends to the field insulation on the drain side of the DMOS to create an effective channel length only between the metallurgical edge of said source adjacent the gate and the bottom of the trench and is of a length of less than about one-half of the gate width.

2. The FET of claim 1 wherein the FET is part of an integrated circuit and a field insulation is disposed in said substrate and surrounds the FET to electrically isolate the FET from devices in the integrated circuit.

3. The FET of claim 1 wherein the gate region at the surface of the substrate extends above the substrate surface.

4. The FET of claim 1 wherein a barrier metal separates each of the conductive contacts from the insulating material.

5. The FET of claim 1 wherein the outer edges of the surface of the gate region are adjacent the source and drain regions and are separated from the source and drain regions by a thin insulating layer thicker than the insulating layer disposed on the walls of the opening for said gate.

6. The FET of claim 2 wherein the contact to the gate region is outside and on the field insulation.

7. The FET of claim 1 wherein the inside angle of converging walls at the bottom of the trench is within a range of about 66° and about 123°.

* * * * *